United States Patent
Schuster et al.

(10) Patent No.: US 7,733,087 B2
(45) Date of Patent: Jun. 8, 2010

(54) SEALED COMPONENT FOR AN MRI SCANNER HAVING AN ACTUATOR FOR ACTIVE NOISE CONTROL

(75) Inventors: Johann Schuster, Oberasbach (DE); Stefan Stocker, Erlangen (DE)

(73) Assignee: Siemens Aktienesellschaft, Munich (DE)

( * ) Notice: Subject to any disclaimer, the term of this patent is extended or adjusted under 35 U.S.C. 154(b) by 1334 days.

(21) Appl. No.: 10/715,987

(22) Filed: Nov. 18, 2003

(65) Prior Publication Data

US 2004/0155658 A1 Aug. 12, 2004

(30) Foreign Application Priority Data

Nov. 18, 2002 (DE) .................................. 102 53 701

(51) Int. Cl.
*G01V 3/00* (2006.01)
(52) U.S. Cl. ....................................... 324/318; 600/410
(58) Field of Classification Search ......... 600/410–423, 600/407, 408; 324/318–322, 378, 306–309; 381/71.2
See application file for complete search history.

(56) References Cited

U.S. PATENT DOCUMENTS

| | | | | |
|---|---|---|---|---|
| 4,954,781 A | * | 9/1990 | Hirata | .......................... 324/318 |
| 5,548,653 A | * | 8/1996 | Pla et al. | ...................... 381/71.2 |
| 5,617,026 A | | 4/1997 | Yoshino et al. | |
| 5,793,210 A | * | 8/1998 | Pla et al. | ....................... 324/318 |
| 5,990,680 A | * | 11/1999 | Mansfield | ..................... 324/318 |
| 6,353,319 B1 | | 3/2002 | Dietz et al. | |
| 6,396,272 B1 | | 5/2002 | Dietz et al. | |
| 6,437,568 B1 | * | 8/2002 | Edelstein et al. | ............. 324/318 |
| 6,519,343 B1 | * | 2/2003 | Mansfield | .................... 381/71.1 |
| 6,831,461 B2 | * | 12/2004 | Arz et al. | ...................... 324/318 |
| 6,954,068 B1 | * | 10/2005 | Takamori et al. | ............. 324/318 |
| 2003/0155174 A1 | * | 8/2003 | Mansfield | .................... 181/207 |

FOREIGN PATENT DOCUMENTS

| | | |
|---|---|---|
| DE | 197 22 211 | 8/1998 |
| JP | 8052123 | 2/1996 |
| WO | WO 98/13821 | 4/1998 |

* cited by examiner

*Primary Examiner*—Brian Casler
*Assistant Examiner*—Nasir Shahrestani
(74) *Attorney, Agent, or Firm*—Schiff Hardin LLP

(57) ABSTRACT

Sealed components for an MRI scanner, in particular carrying RF coils and gradient coils have actuators for active noise control that are a part of an actuator module having holding segments fastened rigidly to the opposite ends of the actuator. The holding segments are fastened by screws onto two actuator receiving elements that are embedded at a spacing from one another in the sealing compound, and so that each fastening segment protrudes into a recess in the compound.

3 Claims, 3 Drawing Sheets

FIG 3
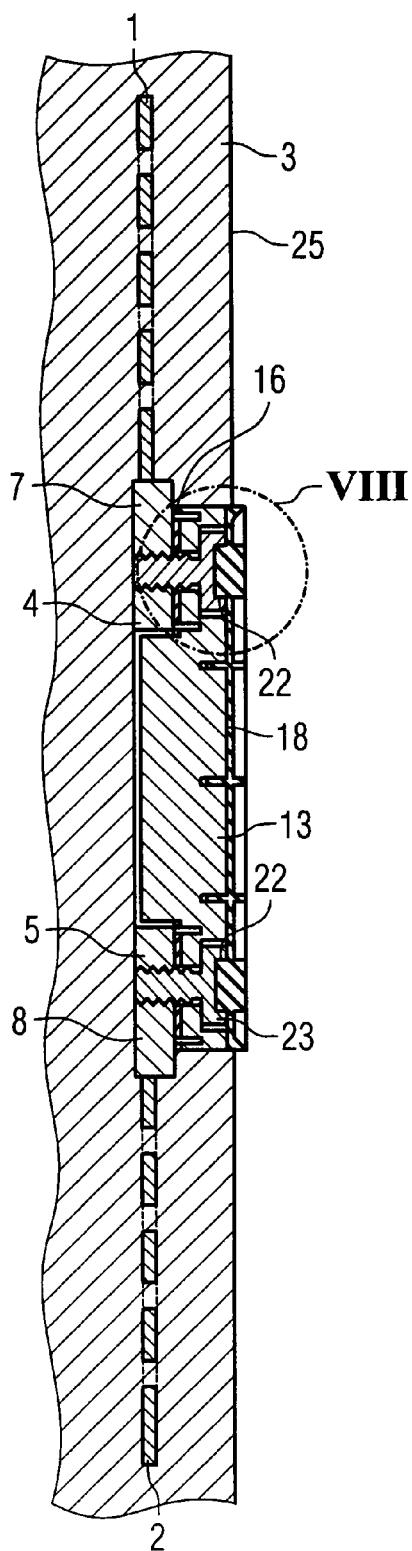
FIG 4
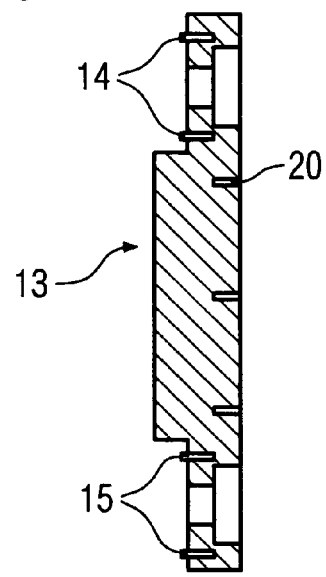
FIG 5
FIG 6
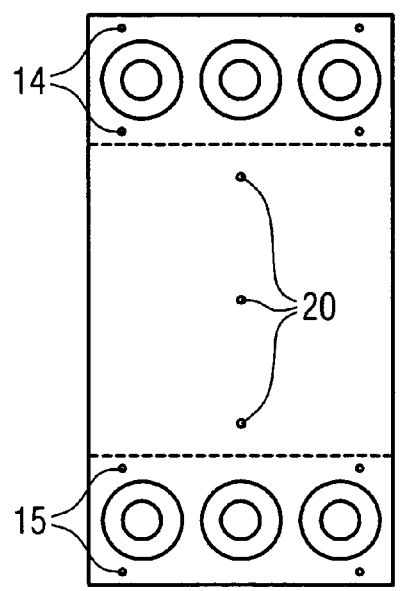
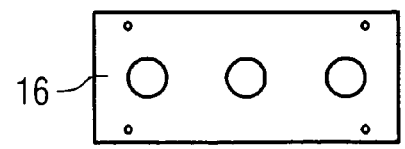

SEALED COMPONENT FOR AN MRI SCANNER HAVING AN ACTUATOR FOR ACTIVE NOISE CONTROL

BACKGROUND OF THE INVENTION

1. Field of the Invention

The present invention relates to sealed components, in particular carrying RF coils and gradient coils for MRI scanners, wherein actuators for active noise control are employed.

2. Description of the Prior Art

Gradient coils in MRI scanners generate magnetic fields that are variable in time and in amplitude. They are operated inside a static basic magnetic field, i.e., in a basic field magnet. Here, dynamic Lorentz forces act on the gradient coil conductors, exciting vibrations in the structure thereof. This results in the production of significant noise during the operation of the scanner.

In order to actively reduce the production of noise, or the intensity of vibration, by a gradient coil, it has been proposed to install actuators (e.g., piezoceramics, magnetostrictive actuators, or the like) at suitable eigenmode-specific locations that during operation generate a counterforce to the Lorentz force of the gradient coil. In this way, in theory a 30 dB reduction in the vibrational amplitudes is quite realistic.

Heretofore, a practical realization of this measure has not occurred, probably due to the difficult technical problem of creating suitable fastening points for the actuators, which enable a transmission of force onto the gradient structure of, typically, around 10 kN per actuator. In each case, the fastening points must be situated inside the resin matrix of the vacuum-sealed coil, so that the points of application of the actuators for the production of a counterforce to the Lorentz force of the gradient coil also are situated at the points where the vibrations that are to be reduced occur.

SUMMARY OF THE INVENTION

An object of the present invention is to provide sealed components of the type described above in such a way that an exact positioning of the actuators is possible at the location at which the noise arises, and wherein the actuators and the electrical terminal lines thereof are situated so as to be able to be exchanged where possible.

This object is achieved according to the present invention by designing each actuator, in the form of an actuator module having holding segments fastened rigidly to the two ends of the actuator, with the holding segments being fastened, in particular screwed, onto two actuator receiving elements that are embedded at a spacing from one another in the sealing compound of the sealed MRI scanner component. Each receiving element has a fastening segment that protrudes into a recess in the sealing compound. The actuator receiving elements can be perforated anchoring plates having threaded holes or bores in the fastening segments. The fastening segments preferably are thicker compared to the remainder of the plates.

Because the vibrational amplitudes are in the sub-millimeter range (typically <10 μm), the binding between the actuator and the actuator receiving elements must take place without play. Bending and torsional stresses in the actuator have a negative effect on the functioning and lifespan of the actuator. For this reason, there is the technical requirement that the elements for the introduction of force be positioned sufficiently precisely in the coil to permit installation of an actuator, after sealing, in a manner free from bending and torsional stresses, and permitting the counter-forces that are to be produced to be introduced into the coil structure in a manner that is loss-free as possible. In order to realize the manufacturing in a simple and economical manner, in an embodiment of the present invention a transmission of force is realized by static friction, i.e., screwed connecting surfaces between the actuator and the actuator receiving elements.

In order to achieve this precision of the positioning of the actuator receiving elements and of the actuator module that is to be fastened to them, to the invention also includes a method in which the two actuator receiving elements are fastened on an installation template that stands out from the compound and corresponds essentially to the base surface of the actuator, and, during the sealing of the component, these two elements are held in the predetermined installation position, in such a way that the fastening surfaces and the threaded holes are not wetted by the sealing compound. Wetting would have an adverse effect on the functioning, not only with respect to the required low-loss and play-free transmission of force but also with respect to the requirement that the actuators be installed with low bending and torsional stresses. The retroactive removal of a film of compound on the contact surfaces would be very labor-intensive, expensive, and would result in insufficient functional reliability. It is therefore very important to prevent a wetting of the contact surfaces by the sealing compound. This is achieved by the method according to the present invention, using an installation template having practically the same construction as the actuator module to be installed later.

After being screwed to the installation template, both actuator-receiving elements are brought into position. In an embodiment of the invention, the installation template is provided with a number of spacing pins seated on the fastening segments of the actuator receiving elements, each pin penetrating an elastic sealing plate that covers a fastening segment, the thickness of this plate being somewhat greater than the length of the spacing pins. During the screwing of the installation template onto the actuator receiving elements, the sealing plate is pressed together far enough so that the spacing pins will come to be seated, and in this way the force transmission surfaces are oriented to one another. The defined gap between the surfaces is completely filled by the sealing plate, which preferably is made of silicon having a Shore hardness of 40, or rubber, or the like, so that it is absolutely certain that no sealing compound can be deposited on the fastening segments.

In order to enable the installation template to be withdrawn after the hardening of the sealing compound and the loosening of the screws on the actuator receiving elements, in an embodiment of the invention the installation template is provided with threaded blind holes in which corresponding withdrawal tools can engage.

In a further embodiment of the method according to the invention, a removable protective plate is provided for the installation template, covering the fastening screws and the threaded blind holes, and preventing a wetting of the outer surface thereof, but specifically also preventing a wetting of the screws and the threaded blind holes during withdrawal. In the simplest case, sealing plugs that engage in press-fit fashion in the threaded blind holes can be used for the fastening of this protective plate. Corresponding sealing plugs also can be provided in the area of the screws, in order to protect the actuating recesses, standardly formed as Allen screws.

DESCRIPTION OF THE DRAWINGS

FIG. 3 is a longitudinal section through the arrangement according to FIG. 1 during the installation of the actuator receiving elements with the aid of an installation template.

FIG. 4 is a section through the installation template.

FIG. 5 is a top view of the installation template.

FIG. 6 is a top view of a sealing plate.

DESCRIPTION OF THE PREFERRED EMBODIMENTS

Figure 1:
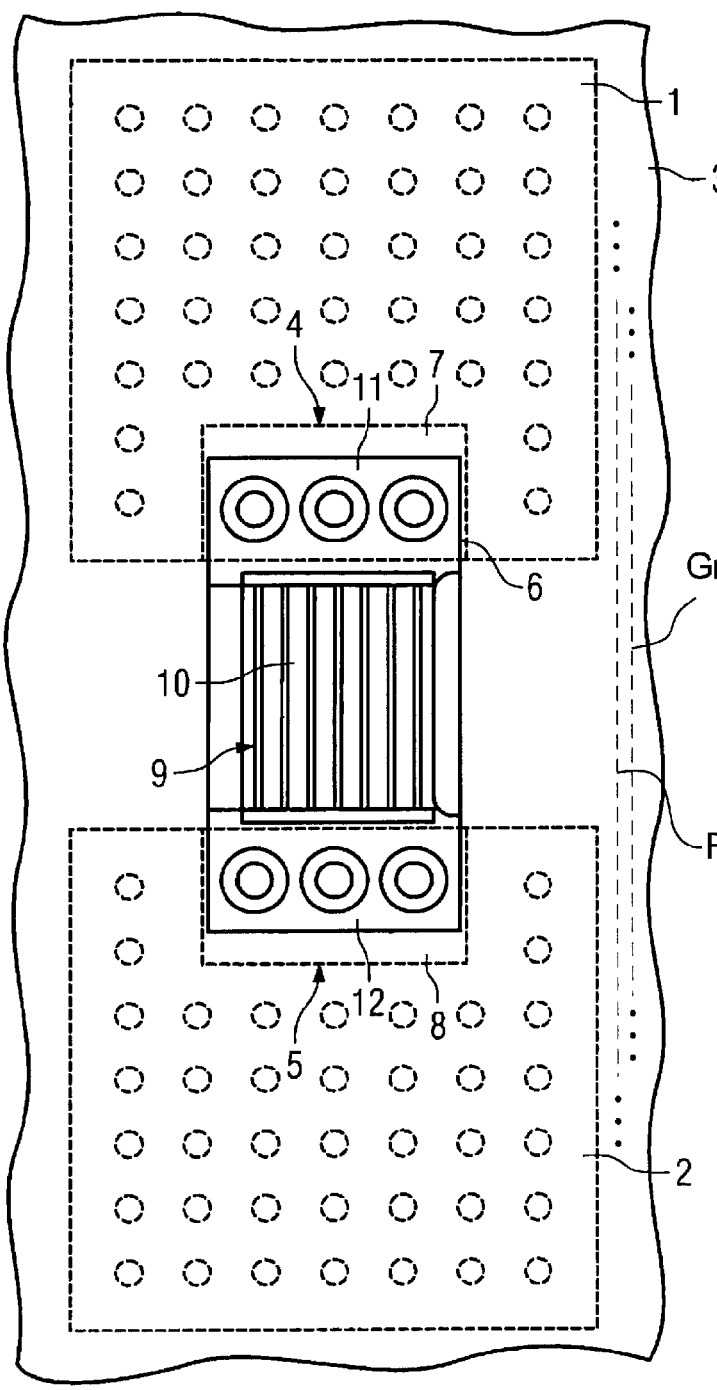
FIG. 1 is a top view of an installation location of a sealed MRI scanner component in accordance with the invention with an actuator module in place.
Figure 2:
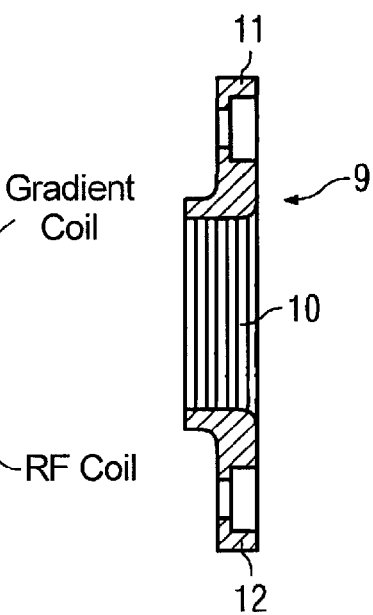
FIG. 2 is a longitudinal section through the actuator module in FIG. 1.
Figure 7:
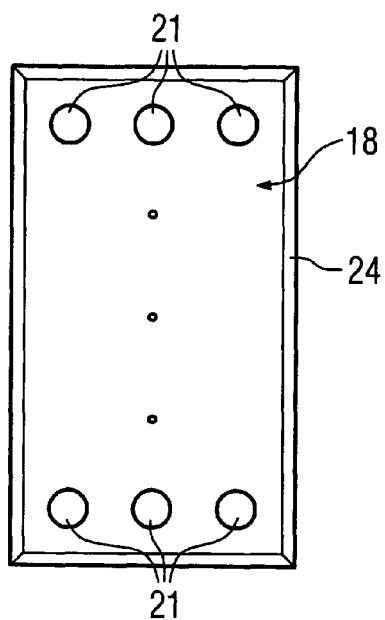
FIG. 7 is a top view of the protective plate for the outer surface of the installation template.
Figure 8:
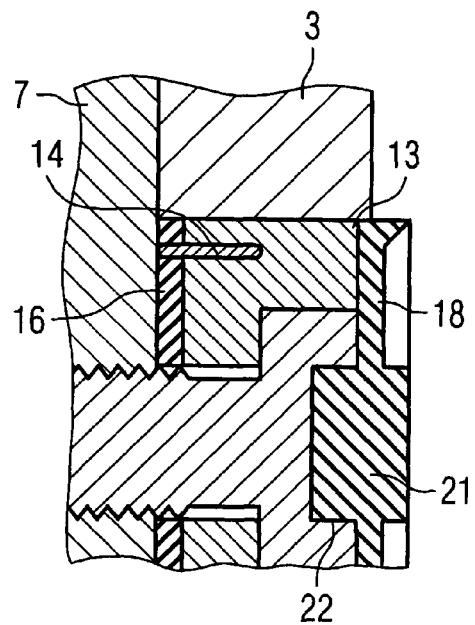
FIG. 8 is an enlarged segment VIII from FIG. 3.
Figure 9:
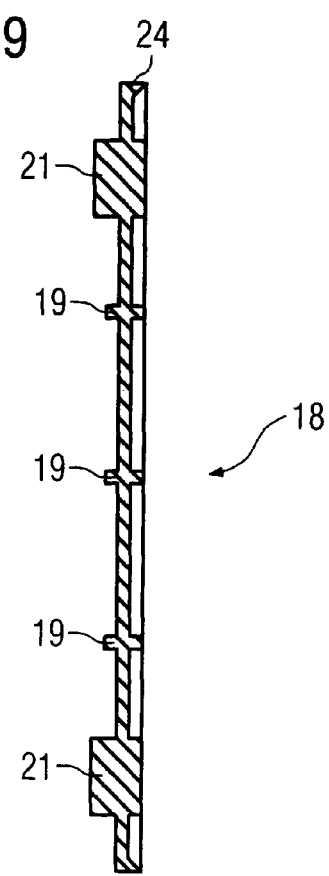
FIG. 9 is a section through the protective plate.

In the exemplary embodiment shown, actuator receiving elements 1 and 2, preferably made of steel or brass, are perforated plates that are embedded in cured sealing compound 3, that carries an RF coil and a gradient coil. Thickened fastening segments 4 and 5 are provided at the front end of these plates, and extend partially into a recess 6. An actuator module 9 is screwed onto regions of contact surfaces 7 and 8 of the fastening segments 4 and 5 that are exposed. The module consists of the actuator 10 and two holding segments 11 and 12 connected rigidly with one end.

For the positioning and bringing the actuator receiving elements 1 and 2 into the sealing compound 3, these actuator receiving elements 1 and 2 are first screwed onto an installation template 13 that is provided with precisely dimensioned spacing pins 14 and 15 in the region of the fastening segments 4 and 5 over contact surfaces 7 and 8. These pins 14 and 15 are seated on contact surfaces 7 and 8 so as to form a defined gap as soon as installation template 13 has been screwed to the actuator receiving elements 1 and 2 with screws. Here, a sealing plate 16 is situated between the components, the sealing plate being thicker by a few tenths of a millimeter than the length of the spacing pins 14, 15. As the screws are tightened, this sealing plate 16, made of silicon, rubber or the like, is compressed, so that the pins 14 and 15 are respectively seated on the contact surfaces 7 and 8, and an exact orientation of the actuator receiving elements 1,2 is achieved. The fastening of the installation template 13 with the actuator receiving elements 1 and 2 screwed thereon can take place if necessary on the outer mold form. For this purpose, for example a bolt (not shown) can be provided on the installation template 13. However, the fastening preferably is achieved by the actuator receiving elements 1 and 2 being fastened to the conductors of the respective coil, or to adjacent cooling coils, at a suitable location, in order to have the allocation of the actuator 10 adapted specifically to the conductor geometry. In practice, this is not always achieved entirely precisely, so that an orientation by fastening to the external mold for the compound may possibly fail to ensure optimal positioning at an eigenmode-specific location.

The installation template 13 is covered by a protective plate 18 that is provided with first sealing plugs 19 that engage in press-fit fashion in blind threaded holes 20 of the installation template 13, these holes being used for the withdrawal of this installation template after the hardening of compound 3. Additional sealing plugs 21 engage in Allen recesses 22 of screws 23, which connect installation template 13 with actuator receiving elements 1 and 2. This prevents sealing compound from being able to penetrate into these Allen recesses 22 or into the blind threaded holes 20, which would have an adverse effect on the intended functioning. The protective plate 18 is provided with a peripheral thickened edge 24, which increases stability. Moreover, it forms a separating edge from sealing surface 25, in order to enable the cover to be removed from the mold more easily.

The present invention is not limited to the depicted exemplary embodiment. The actuator receiving elements can be formed and constructed in a different manner. The same is true for the shape and construction of the installation template 13, for which it is essential only to keep open the overall space for receiving the actuator module 9, also ensuring that contact surfaces 7 and 8, for the screwed fastening of the actuator module onto actuator receiving elements 1 and 2, are kept free of sealing compound.

Although modifications and changes may be suggested by those skilled in the art, it is the intention of the inventors to embody within the patent warranted hereon all changes and modifications as reasonably and properly come within the scope of their contribution to the art.

We claim as our invention:

1. A sealed component for a magnetic resonance imaging scanner comprising:

cured sealing compound comprising at least one RF coil therein and at least one gradient coil therein for magnetic resonance imaging; and an actuator module comprising an actuator for active noise control during magnetic resonance imaging, said actuator having opposite ends, two holding segments respectively rigidly fastened to the opposite ends of the actuator, two actuator receiving elements respectively fastened to the two holding segments, said two actuator receiving elements being embedded in the cured sealing compound with a spacing between said two actuator receiving elements, and each of said two receiving elements having a fastening segment that protrudes into a recess in the cured sealing compound.

2. A sealed component as claimed in claim 1 wherein said two holding segments are respectively screwed onto said two actuator receiving elements.

3. A sealed component as claimed in claim 2 wherein each of said two actuator receiving elements comprises a perforated anchoring plate region connected to the fastening segment, each fastening segment being thicker than said plate region and said fastening segments having threaded bores therein for respectively receiving screws for fastening to one of said holding segments.

* * * * *